United States Patent
Wu et al.

(10) Patent No.: US 7,821,565 B2
(45) Date of Patent: Oct. 26, 2010

(54) IMAGING MODULE PACKAGE

(75) Inventors: Ying-Cheng Wu, Taipei Hsien (TW);
Pang-Jung Liu, Taipei Hsien (TW);
Chien-Cheng Yao, Taipei Hsien (TW);
Shih-Min Lo, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 398 days.

(21) Appl. No.: 12/019,918

(22) Filed: Jan. 25, 2008

(65) Prior Publication Data
US 2009/0122176 A1 May 14, 2009

(30) Foreign Application Priority Data
Nov. 14, 2007 (CN) .......................... 2007 1 0202537

(51) Int. Cl.
*H04N 5/225* (2006.01)
*G02B 13/16* (2006.01)
(52) U.S. Cl. .................. 348/340; 348/335; 348/374
(58) Field of Classification Search .............. 348/294, 348/340, 374
See application file for complete search history.

(56) References Cited

U.S. PATENT DOCUMENTS

| 7,005,310 | B2 * | 2/2006 | Hanada et al. ............... 438/25 |
| 7,405,760 | B2 * | 7/2008 | Cho et al. ................... 348/340 |
| 7,456,901 | B2 * | 11/2008 | Jeong et al. ................. 348/374 |
| 7,633,543 | B2 * | 12/2009 | Shinomiya ................... 348/340 |
| 7,720,374 | B2 * | 5/2010 | Kim et al. .................... 396/275 |
| 2003/0128442 | A1 * | 7/2003 | Tanaka et al. ................ 359/819 |
| 2004/0095502 | A1 | 5/2004 | Losehand et al. |
| 2005/0179102 | A1 * | 8/2005 | Weiblen et al. ............. 257/432 |
| 2005/0270403 | A1 * | 12/2005 | Adachi et al. ................ 348/340 |
| 2007/0146534 | A1 * | 6/2007 | Kim et al. .................... 348/340 |
| 2007/0236596 | A1 * | 10/2007 | Sekine et al. ................ 348/340 |

FOREIGN PATENT DOCUMENTS

CN 1980325 A 6/2007

\* cited by examiner

*Primary Examiner*—Jason Chan
*Assistant Examiner*—Pritham Prabhakher
(74) *Attorney, Agent, or Firm*—Jeffrey T. Knapp

(57) ABSTRACT

An exemplary imaging module package includes a lens module and an imaging sensor module. The lens module includes a housing having a hollow top portion and a hollow bottom portion coaxially aligned with the hollow top portion. The imaging sensor module is received in the hollow bottom portion. The imaging sensor module includes an imaging sensor connected to the substrate and secured to the bottom portion, a substrate spaced from the bottom portion and defining at least one recess therein, and a plurality of passive components received in the at least one recess and wholly disposed below the imaging sensor.

10 Claims, 2 Drawing Sheets

IMAGING MODULE PACKAGE

CROSS-REFERENCE OF RELATED APPLICATION

This application is related to a co-pending U.S. patent application Ser. No. 12/013,929, entitled "IMAGING MODULE PACKAGE", which was filed on Jan. 14, 2008 and assigned to the same assignee. The disclosure of the above identified application is incorporated herein by reference.

BACKGROUND

1. Technical Field

The present invention relates to imaging technology and, particularly, to an imaging module package having a compact configuration.

2. Description of Related Art

An imaging sensor module generally comprises a substrate, an imaging sensor, and a plurality of passive components mounted to the substrate. The passive components are substantially disposed at a same level with the imaging sensor, and surround the imaging sensor. The imaging sensor is physically and electrically connected to the substrate via a plurality of soldering pads between the imaging sensor and the substrate. The passive components are separated from the imaging sensor for facilitating heat dissipation and avoiding EMI. A total area of the imaging sensor module is larger than the actual area occupied by the imaging sensor and the passive components.

Typically, digital still cameras are desired to be compact for portability. Thus, it is desirable that an imaging module package using the imaging sensor module be compact. However, the imaging sensor module is bulky, because the substrate must have a large enough top surface for supporting both the imaging sensor and the passive components thereon and occupies a large space of the imaging module package.

What is needed, therefore, is an imaging module package which has a compact configuration.

SUMMARY

According to a present embodiment, an imaging module package includes a lens module and an imaging sensor module. The lens module includes a housing having a hollow top portion and a hollow bottom portion coaxially aligned with the hollow top portion. The imaging sensor module is received in the hollow bottom portion. The imaging sensor module includes an imaging sensor connected to the substrate and secured to the bottom portion, a substrate spaced from the bottom portion and defining at least one recess therein, and a plurality of passive components received in the at least one recess and wholly disposed below the imaging sensor.

Other advantages and novel features will be drawn from the following detailed description of at least one embodiment, when considered in conjunction with the attached drawings.

DETAILED DESCRIPTION OF THE EMBODIMENTS

Figure 1:
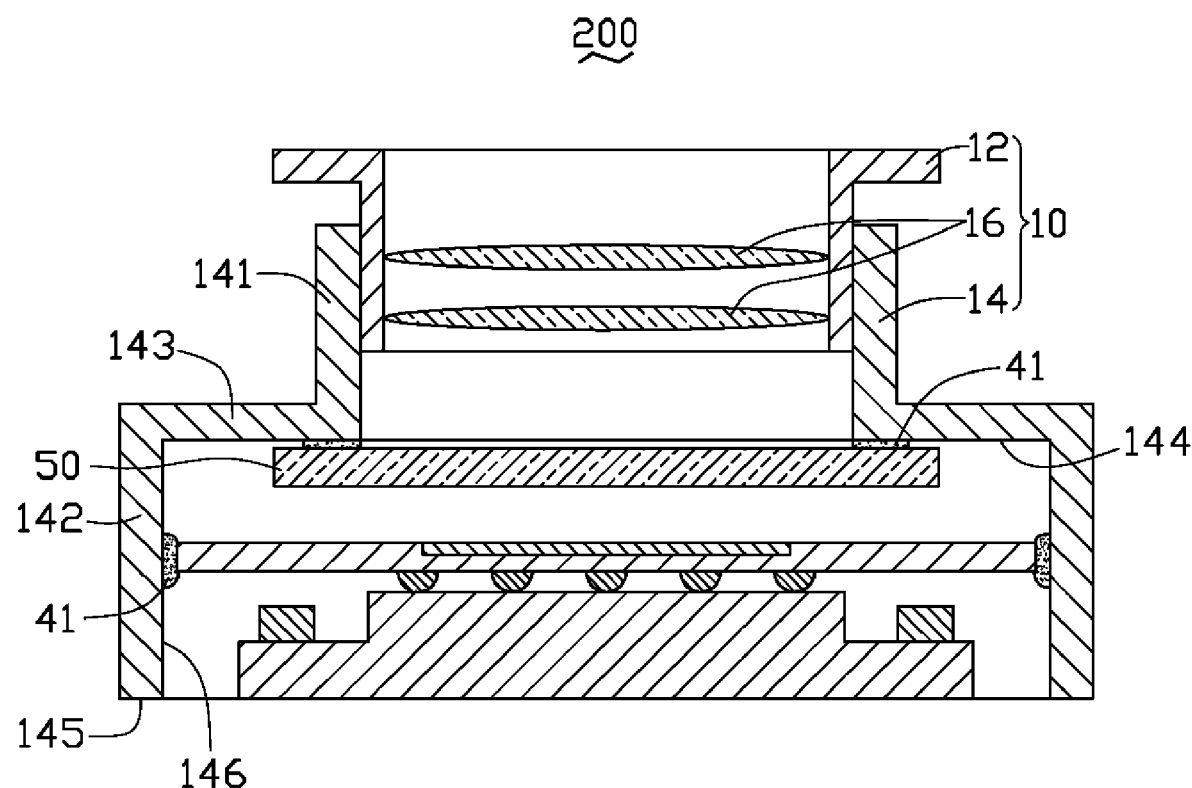
FIG. 1 is a cross-sectional view of an imaging module package, according to an embodiment.

Referring to FIG. 1, an imaging module package 200 according to an embodiment is illustrated. The imaging module package 200 comprises a lens module 10, and an imaging sensor module 100 secured to the lens module 10 via adhesive 41.

The lens module 10 comprises a lens barrel 12, a housing 14, and lenses 16. The housing 14 comprises a hollow top portion 141, a hollow bottom portion 142 coaxially aligned with the hollow top portion 141, and a connecting plate 143 connecting the top and bottom portions 141, 142. The top portion 141 is smaller than and coaxially aligned with the bottom portion 142. The lenses 16 are received in the lens barrel 12, and the combined lens barrel 12 and lenses 16 are received in the top portion 141 of the housing 14. The connecting plate 143 comprises a bottom surface 144 facing the imaging sensor module 100. A transparent plate 50 is secured to the bottom surface 144 of the connecting plate 143 by the adhesive 41. The bottom portion 142 receives the imaging sensor module 100 therein, and comprises a bottom surface 145 and an inner side surface 146.

Figure 2:
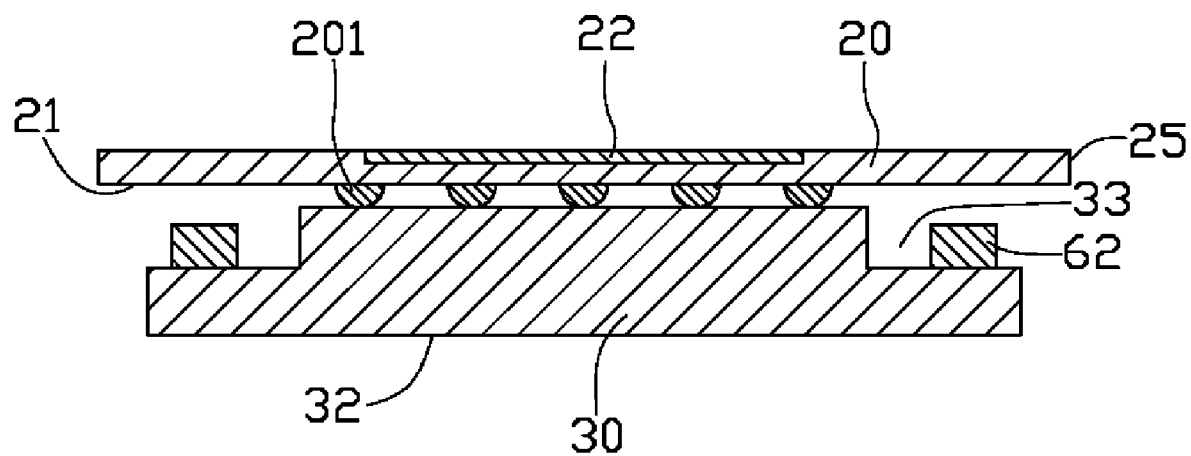
FIG. 2 is a cross-sectional view of an imaging sensor module of the imaging module package of FIG. 1.

Referring to FIG. 2, the imaging sensor module 100 comprises an imaging sensor 20, a substrate 30, and a plurality of passive components 62 such as resistors, capacitors, or inductors. The imaging sensor 20 is physically and electrically connected to the substrate 30 via a plurality of soldering pads 201 between the imaging sensor 20 and the substrate 30. The passive components 62 are mounted to the substrate 30 and are wholly disposed below the imaging sensor 20.

The substrate 30 defines at least one recess 33 facing the imaging sensor 20, for receiving the passive components 62 therein, and comprises a bottom surface 32. In the embodiment, the substrate 30 defines two recesses 33 therein. The imaging sensor 20 may be a charge coupled device (CCD) imaging sensor or a complementary metal oxide semiconductor (CMOS) imaging sensor. The imaging sensor 20 comprises a bottom surface 21 above the substrate 30, a central sensing area 22 at a top side thereof, and a circumferential side surface 25 surrounding the bottom surface 21 and the central sensing area 22.

Referring to FIGS. 1-2, to secure the imaging sensor module 100 to the bottom portion 142 of the housing 14, the circumferential side surface 25 of the imaging sensor 20 is adhered to the inner side surface 146 via the adhesive 41, with the sensing area 22 facing the transparent plate 50. Optical centers of the lenses 16 are aligned with a center of the sensing area 22. The substrate 30 is spaced from the inner side surface 146 of the bottom portion 142, but the bottom surface 32 of the substrate 30 is coplanar with the bottom surface 145 of the bottom portion 142.

It will be understood that the above particular embodiments and methods are shown and described by way of illustration only. The principles and features of the present invention may be employed in various and numerous embodiments thereof without departing from the scope of the invention as claimed. The above-described embodiments illustrate the scope of the invention but do not restrict the scope of the invention.

What is claimed is:

1. An imaging module package comprising:
a lens module comprising a housing having a hollow top portion and a hollow bottom portion coaxially aligned with the hollow top portion; and
an imaging sensor module received in the hollow bottom portion, the imaging sensor module comprising an imaging sensor connected to a substrate and secured to the bottom portion, the imaging sensor comprising a first bottom surface above the substrate; the substrate defining a first upper surface corresponding to the central area of the first bottom surface, a second upper surface parallel to the first upper surface and surrounding the first upper surface, and a second bottom surface opposite to the second upper surface, the first upper surface higher than the second upper surface relative to the second bottom surface; at least one recess being defined between the first upper surface and the second upper surface; a plurality of soldering pads being formed between the first bottom surface and the first upper surface for physically and electrically connected the imaging sensor to the substrate and a plurality of passive components received in the at least one recess and wholly disposed below the imaging sensor.

2. The imaging module package as claimed in claim 1, wherein the at least one recess faces the imaging sensor.

3. The imaging module package as claimed in claim 1, wherein the hollow bottom portion comprises an inner side surface, and the imaging sensor comprises a circumferential side surface secured to an inner surface of the hollow bottom portion.

4. The imaging module package as claimed in claim 3, further comprising an adhesive to adhere the circumferential side surface of the imaging sensor to the inner side of the hollow bottom portion.

5. The imaging module package as claimed in claim 4, wherein the imaging sensor comprises a central sensing area at a top side thereof, and optical centers of the lens module are aligned with a center of the sensing area.

6. The imaging module package as claimed in claim 4, wherein the hollow bottom portion comprises a bottom surface, and the substrate comprises a bottom surface coplanar with the bottom surface of the hollow bottom portion.

7. The imaging module package as claimed in claim 4, further comprising a transparent plate disposed between the top portion and the imaging sensor module.

8. The imaging module package as claimed in claim 7, wherein the housing comprises a connecting plate to connect the hollow top and bottom portions, and the transparent plate is positioned to the connecting plate.

9. The imaging module package as claimed in claim 8, wherein the transparent plate is adhered to the connecting plate.

10. The imaging module package as claimed in claim 4, wherein the lens module further comprises a lens barrel, and lenses received in the lens barrel, and the lens barrel together with the lenses are received in the hollow top portion.

* * * * *